(12) United States Patent
Zhang et al.

(10) Patent No.: US 8,420,407 B2
(45) Date of Patent: Apr. 16, 2013

(54) GROWTH METHOD OF FE$_3$N MATERIAL

(75) Inventors: Rong Zhang, Jiangsu (CN); Zili Xie, Jiangshu (CN); Bin Liu, Jiangshu (CN); Xiangqian Xiu, Jiangshu (CN); Henan Fang, Jiangshu (CN); Hong Zhao, Jiangshu (CN); Xuemei Hua, Jiangshu (CN); Ping Han, Jiangshu (CN); Peng Chen, Jiangshu (CN); Youdou Zheng, Jiangshu (CN)

(73) Assignee: Nanjing University, Nanjing, Jiangsu Province (CN)

( * ) Notice: Subject to any disclaimer, the term of this patent is extended or adjusted under 35 U.S.C. 154(b) by 410 days.

(21) Appl. No.: 12/772,508

(22) Filed: May 3, 2010

(65) Prior Publication Data

US 2011/0269250 A1     Nov. 3, 2011

(51) Int. Cl.
*H01L 21/00*     (2006.01)
*H01L 21/469*     (2006.01)
*H01L 21/8246*     (2006.01)

(52) U.S. Cl.
USPC ................. 438/3; 438/775; 257/E21.665

(58) Field of Classification Search ............... 438/3, 775
See application file for complete search history.

(56) References Cited

FOREIGN PATENT DOCUMENTS

CN     101330005 A   *   12/2008
JP     06157012 A   *   6/1994

* cited by examiner

*Primary Examiner* — Charles D. Garber
*Assistant Examiner* — Calvin Choi
(74) *Attorney, Agent, or Firm* — Global IP Services; Tianhua Gu

(57) ABSTRACT

A kind of growth method of Fe$_3$N in the MOCVD system, comprising following process: 1) make the surface nitridation of sapphire substrate; 2) pump in carrier gas N$_2$, ammonia and organic gallium sources, and grow low temperature GaN buffer on substrate; 3) raise temperature and grow the GaN supporting layer; 4) pump in FeCp$_2$ as Fe sources, then grow Fe$_3$N on the GaN supporting layer; the Fe$_3$N granular films and the Fe$_3$N single crystal films are obtained.

3 Claims, 4 Drawing Sheets

The atomic force microscopic picture of Fe$_3$N films growing at 600°C, 750°C, 900°C and 1050°C

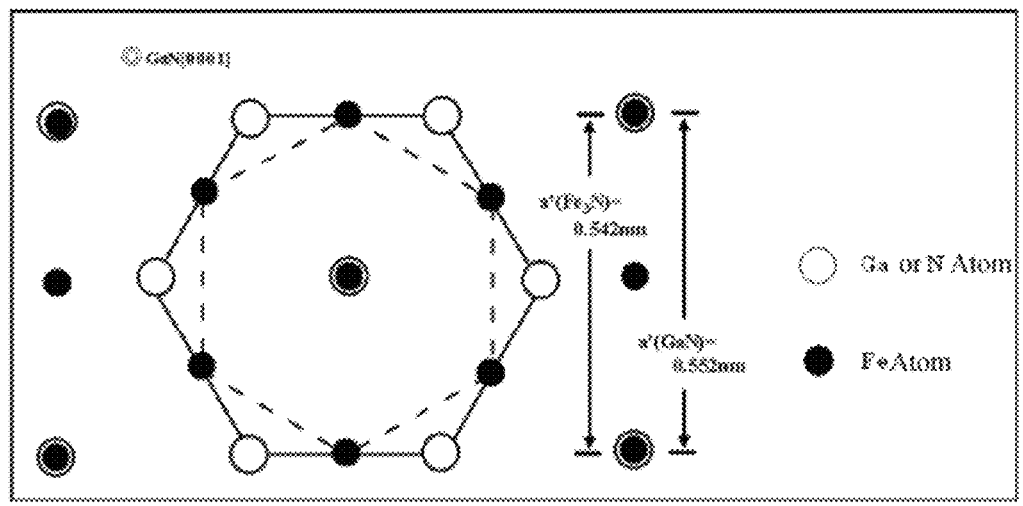
Figure 1 Match figure of Fe₃N and c-plane GaN
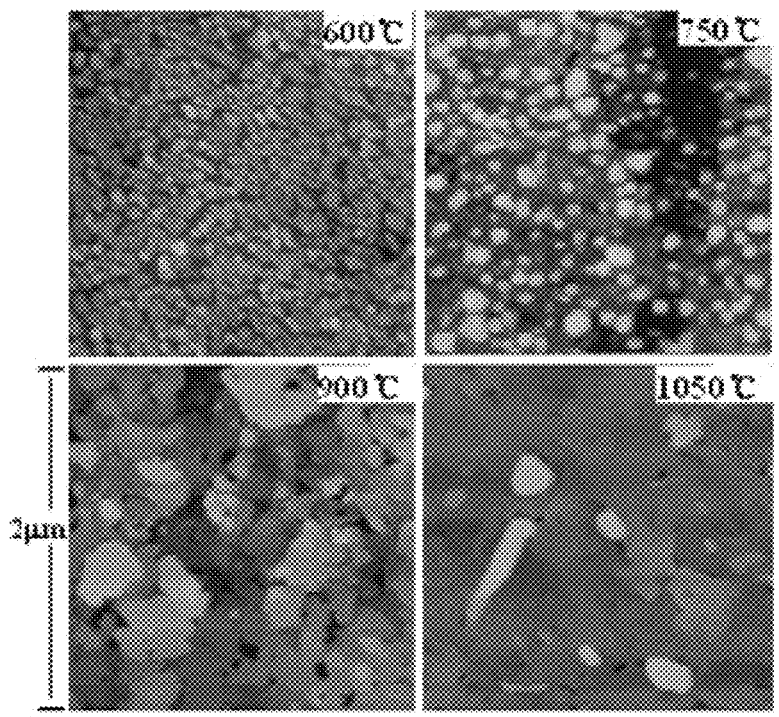
Figure 2 The atomic force microscopic picture of Fe₃N films growing at 600°C, 750°C, 900°C and 1050°C

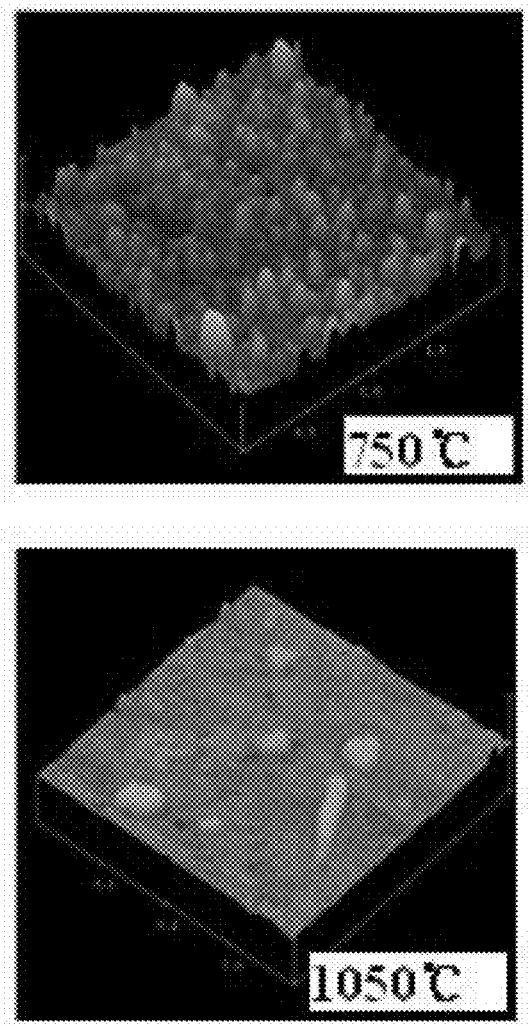
Figure 3 The surface roughness of Fe₃N films growing at 750°C and 1050°C in the invention

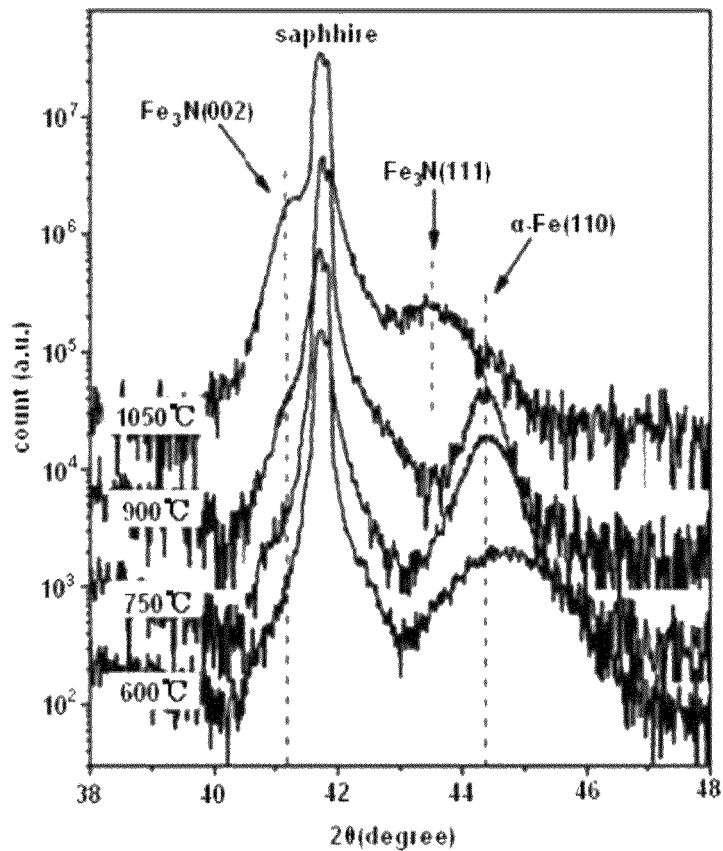
Figure 4 The XRD spectra of Fe$_3$N films growing at 600°C, 750°C, 900°C and 1050°C in the invention

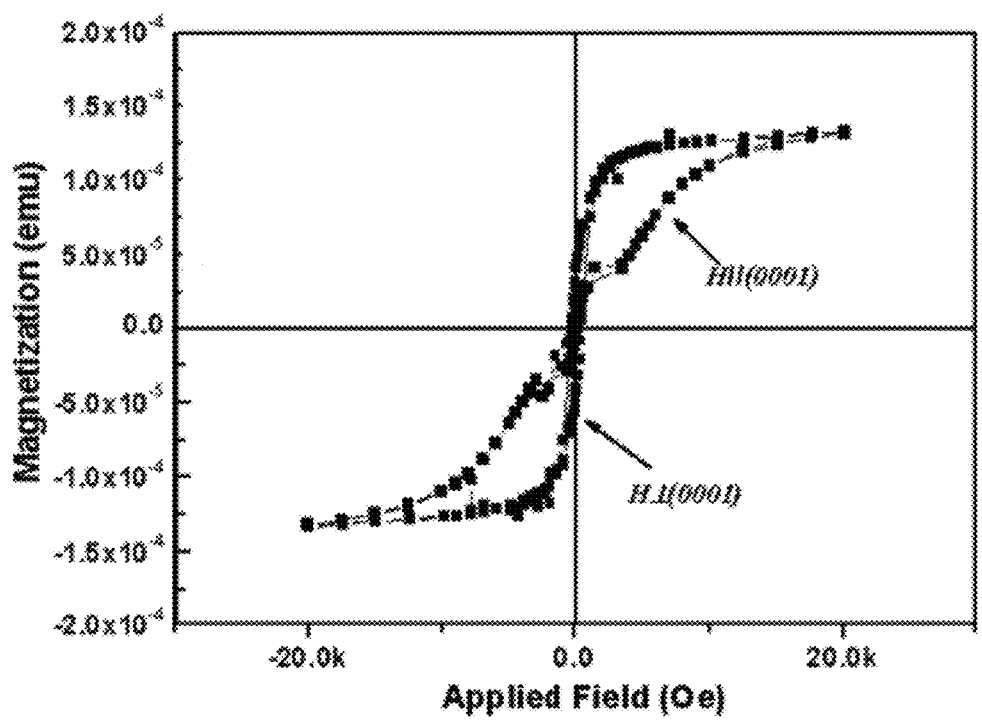
Figure 5　The magnetic hysteresis hoop at room temperature of the Fe$_3$N films growing at 1050℃ in the invention
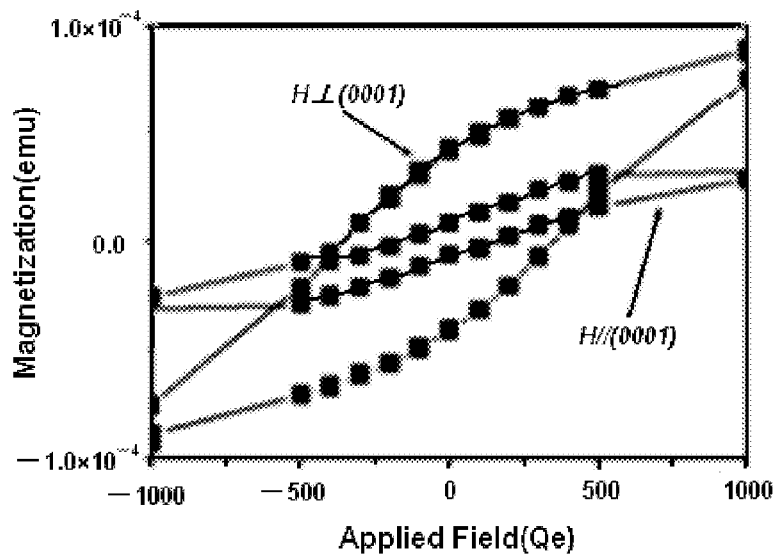
Figure 6　The center amplification graph

GROWTH METHOD OF FE₃N MATERIAL

FIELD OF THE INVENTION

This invention involves growth method of magnetic material $Fe_xN$, especially growing $Fe_3N$, in particular, it is a kind of growth method of $Fe_3N$ by the metal organic chemical vapor deposition (MOCVD).

BACKGROUND OF THE INVENTION

In the past few years, microelectronic devices based on GaN have rapid development, and the research of spin electronic devices which are relevant to GaN get much attention. Especially, the research of magnetic metal GaN heterostructure is especially concerned. It is notable that the $Fe_3N$ with hexagonal structure is epitaxial to the GaN with hexagonal structure, and the lattice mismatch is only 1.8%, as shown in FIG. 1. It provides innate conditions for combining magnetic material $Fe_3N$ with semiconductor material GaN [1, 2].

According to different components, $Fe_xN$ material could be mainly divided to two categories: x<2; x≧2. When x<2, in such components the iron nitrides gets face-centered cubic structure, and appears paramagnetism, so we do not consider it. When x≧2, there are mainly $\xi$-$Fe_2N$, $\epsilon$-$Fe_3N$ and $\gamma$-$Fe_4N$, the curie temperature of each one is 9K, 575K and 761K respectively. $Fe_2N$ doesn't appear ferromagnetism at a room temperature, so it has no much practical value in magneto electronics and device design. However, $\epsilon$-$Fe_3N$ and $\gamma$-$Fe_4N$ have ferromagnetism at a room temperature, therefore wide attention is brought for using them in magnetic storage and other magnetic function devices[3, 4].

The advantage of $Fe_3N$ and $Fe_4N$ in device design is that they both have high spin polarization. The spin polarizations of transition-metal and alloys are shown in Table 1[5], and the spin polarizations of magnetic oxides are shown in Table 2[6]. Theoretical calculation indicates that spin polarizations of $Fe_3N$ and $Fe_4N$ are 0.5 and 0.7 respectively[7, 8], so both of them can serve as a injection layer of spin polarization current to be used for spin-electronics devices.

TABLE 1

| Spin polarizations of transition-metal and alloys | | | | | | |
|---|---|---|---|---|---|---|
| | Metal | | | | | |
| M (metal) | Ni | Co | Fe | $Ni_{80}Fe_{20}$ | $Co_{50}Fe_{50}$ | $Co_{84}Fe_{16}$ |
| P (%) (spin polarizations) | 33 | 45 | 44 | 48 | 51 | 49 |

TABLE 2

| Spin polarizations of magnetic oxides | | | |
|---|---|---|---|
| | Magnetic oxides | | |
| M (metal) | $CrO_2$ | $Fe_3O_4$ | $La_{0.61}Sr_{0.23}MnO_3$ |
| P (%) (spin polarizations) | 90 ± 3.6 | 40 | 72 |

$Fe_3N$ has a cubic structure, as shown in FIG. 1, which has been epitaxial on MgO(100) substrate by a single crystal structure, and it has brought widely attention in fields of magnetic recording and magnetic tunnel junction[3, 4]. Due to the difficulties of material growth[9, 10], the synthesis of thin samples of $Fe_3N$ and the research reports on its properties are less. The growth quality of films is generally not good [11].

At present, the growth methods of $Fe_3N$ films has dc magnetron sputtering and pulsed laser deposition. As these growth technology could not control the formation of crystal lattice and provide well growth environment, therefore $Fe_3N$ films with good crystal quality cannot be obtained. Yamaguchi et al., by using MBE technology[1] and AlN/3C—SiC serving as interposed layer, had extended c-axis oriented $Fe_3N$ films to Si(111) substrate successfully. Furthermore, Gajbhiye et al. had synthesized $Fe_3N$—GaN core-shell structure, and studied its properties[2]. However, on the current all-purpose sapphire substrate, these methods cannot form $Fe_3N$ films on $Al_2O_3$ (0001) substrate.

[1] K. Yamaguchi, T. Yui, K. Yamaki et al, J. Crys. Growth 301, 579 (2007)
[2] N. S. Gajbhiye and S. Bhattacharyya, Nanotechnology 16, 2012 (2005)
[3] T. Takahashi, N. Takahashi, T. Nakamura et al, Solid State Sci. 6, 97 (2004)
[4] S. Kokado, N. Fujima, K. Harigaya et al, Phys. Stat. Sol. (c) 3, 3303 (2006)
[5] J. S. Moodera, JMMM, 1999, 200:248
[6] R. J. Soulou, Science 1999, 282:85
[7] K. Yamaguchi, T. Yui, K. Yamaki et al, J. Crys. Growth 301, 579 (2007)
[8] M. Sifkovits, H. Smolinski, S. Hellwig et al, J. Magn. Magn. Mater. 204 (1999)
[9] R. Dubey, A. Gupta and J. C. Pivin, Phys. Rev. B 74, 214110 (2006)
[10] S. Matar, B. Siberchicot, M. Penicaud et al, J. Phys. I France 2, 1819 (1992)
[11] S. L. Roberson, D. Finello, A. D. Banks et al, Thin Solid Films 326, 47 (1998)

SUMMARY OF THE INVENTION

The purposes for this invention are: in view of the increasing application of the $Fe_xN$ material on magnetic storage and other magnetic function devices, more $Fe_xN$ material need to be provided. Especially, the growth method of $Fe_3N$ material is the key for obtaining the $Fe_3N$ with good quality. As the product quality could not satisfy the requirements by the present growth methods of $Fe_3N$, so new growth methods of $Fe_3N$ need to be studied. No report of growing $Fe_3N$ films on sapphire substrate by MOCVD is discovered. This invention provides a method of growing $Fe_3N$ films on sapphire substrate by MOCVD successfully.

The technology project of this invention is that a method of growing $Fe_3N$ in a metal organic chemical vapor deposition (MOCVD), comprising following process:

1). A sapphire substrate is heat treated at 1000-1100° C. and then pumping into ammonia for the surface nitridation at the same temperature;

2). Pump into carrier gas $N_2$, ammonia and organic gallium sources, and grow 5-50 nm low temperature GaN buffer on the substrate which has been treated by process 1).

3). After growing low temperature GaN buffer, the temperature is raised to 1000-1150° C., continue to grow 10 minutes, to get a GaN supporting layer of 50 nm.

4). After growing GaN supporting layer, pump into $FeCp_2$ as a Fe source, and a flux of the Fe source is 50-200 sccm, and the $Fe_3N$ grow.

In the system of MOCVD, the organic gallium sources is trimethyl gallium, the flux is 1-50 sccm, and the growth time of $Fe_3N$ is 5-3600 s; the intensity of pressure in reaction chamber is controlled at 0.1-2 atmospheric pressure; the flux of ammonia is controlled at 500-700 sccm, and V/III ratio which denotes the mole ratio of nitrogen and gallium is 500-50000.

In the process of growing $Fe_3N$ in step 4), the hydrogen is as carrier gas, and the intensity of pressure in reaction chamber is controlled at 0.1 atmospheric pressure, and the $Fe_3N$ granular films with granular surface and the $Fe_3N$ single crystal films with layered structure surface are gotten. With the rise of growth temperature, the surface of $Fe_3N$ films become from granular structure to layered structure.

The sample grows at 600° C., the surface of films is granular, and the height of granules is all less than 100 nm. With the rise of temperature, the size of granules which grow on the surface of sample at 750° C. become bigger, the density less, and they develop to flats; when the temperature reaches 900° C., the surface of films begins to form layered structure, and when the growth temperature reaches 1050° C., the layered structures of surface combine with each other, forming plane film surface.

This invention firstly grows a layer of GaN on sapphire substrate, then continue to grow ferromagnetic $Fe_3N$ on GaN supporting layer by metal organic chemical vapor deposition MOCVD technology. Among them, the using of GaN supporting layer, growth temperature of $Fe_3N$ and flux of $FeCp_2$ are the key of obtaining good quality $Fe_3N$ material in the invention.

The invention is a growth method of $Fe_3N$ by MOCVD, especially though controlling the temperature of MOCVD growth technology, source flow and treatment of substrate, thus the growth method and the process control of growth technology have advancement. The invention prepares $Fe_3N$ of high quality on sapphire substrate by MOCVD successfully, and directly extends $Fe_3N$ of hexagonal structure to GaN of hexagonal structure, thus obtains ferromagnetic metal/GaN structure. Compare to other growth method of $Fe_3N$, the invention can directly obtain ferromagnetic metal/GaN heterostructure which lattice mismatch is only 1.8%. The method is easy, the growth process could be controlled, and the structure of $Fe_3N$ could be controlled. Accordingly, the problem of growing $Fe_3N$ with difficulty is solved, the invention solves it by controlling and adjusting the conditions for the flux of organic gallium source and iron source, growth temperature, growth time, the flux of ammonia, and mole ratio of N and Ga. Through the whole growth process in the invention, high quality $Fe_3N$ films are obtained via strict control of conditions for temperature and the flux ratio of reactants.

BRIEF DESCRIPTION OF THE DRAWINGS

FIG. 1 Matching figure of $Fe_3N$ and c-plane GaN.
FIG. 2 is AFM of the sample in the invention.
FIG. 3 is the surface roughness of $Fe_3N$ films growing at 750° C. and 1050° C. in the invention.
FIG. 4 is XRD spectra of the sample in the invention.
FIG. 5 is measure (M-H) curve for magnetic hysteresis hoop of the sample growing at 1050° C. in the invention.
FIG. 6 is the center amplification of curve in FIG. 5, and the detail of vertical and horizontal terms can be seen.

DETAIL DESCRIPTION OF THE INVENTION

The invention is a kind of method of growing $Fe_3N$ films on sapphire substrate by the metal organic chemical vapor deposition MOCVD epitaxy growth system. It comprises following process:

1). The sapphire substrate is heat treated at 1000-1100° C. and then pumping in ammonia for the surface nitridation at the same temperature;

2). Pump in carrier gas $N_2$, ammonia and organic gallium sources, and grow 5-50 nm low temperature GaN buffer on the substrate which has been treated by process 1).

3). After growing low temperature GaN buffer, the temperature is raised to 1000-1150° C., and then the temperature continues to grow 10 minutes, thereby the GaN supporting layer of 50 nm can be gotten.

4). After growing GaN supporting layer, pump in $FeCp_2$ as Fe sources, and the flux of Fe source is 50-200 sccm, and the GaN grows.

The organic gallium source is trimethyl gallium, the flux is 1-50 sccm, and the growth time of $Fe_3N$ is 5-3600 s; the flux of ammonia is controlled at 500-700 sccm, and the V/III ratio which denotes mole ratio of nitrogen and gallium is 500-50000; ferrocene is controlled by the flux of sources, and the intensity of pressure in reaction chamber is controlled at 0.1-2 atmospheric pressure; optimal selection is keeping 0.1 atmospheric pressure.

FIG. 1 Matching figure of $Fe_3N$ and c-plane GaN. It can be seen from the figure that, the lattice mismatch is only 1.8% when extend $Fe_3N$ of hexagonal structure to GaN of hexagonal structure, FIG. 2 is the atomic force microscopic picture of $Fe_3N$ films growing at 600° C., 750° C., 900° C. and 1050° C. The size of all picked study regions is 2×2 μm. As shown in FIG. 2, the sample which grows at 600° C., the surface is composed by some extremely tiny granules, and the height of granules is all less than 100 nm. The size of granules which grow on the surface of sample at 750° C. becomes bigger, the density less. When the temperature reaches 900° C., the surface of sample begins to form layered structure, and when the growth temperature reaches 1050° C., the layered structures of surface combine with each other, forming film structure of good quality.

FIG. 3 is the surface roughness of $Fe_3N$ films growing at 750° C. and 1050° C. in the invention, and it can be seen that, the surface of $Fe_3N$ films growing at high temperature is more flat.

FIG. 4 is XRD spectra of $Fe_3N$ films growing at 600° C., 750° C., 900° C. and 1050° C. in the invention. The range of abscissa is from 38° to 48°, and the ordinate uses log coordinate. Combining with the foregoing results of AFM, it can be seen that: when the growth temperature is relatively low (600° C., 750° C.), the epitaxial material on GaN is mainly granules of α-Fe single substance, thus the films of granules are obtained. However, when the growth temperature is relatively high (900° C., 1050° C.), resultant material is mainly single crystal films of $Fe_3N$, and the $Fe_3N$ sample growing at such condition already had extremely high c-axis orientation. We conclude that this is resulted from two reasons. Firstly, the decomposition of ammonia is different at different temperature, which causes the difference of generating composition at different temperature. When the growth temperature is low, the decomposition of ammonia is insufficient, and only the ferrocene decompose, iron atom deposits on GaN film, so granules of α-Fe single substance are easy to be formed; with the rise of growth temperature, the molecules of ammonia decompose largely to react with ferrocene adequately and to form $Fe_3N$, which extend to GaN. Secondly, it is relating to properties of iron nitrides. The sample growing at high temperature (1050° C.), grows in the equilibrium process. When the temperature is high and the environment is N-rich, the $Fe_3N$ phase of hexagonal structure can more easily exist stably. So that, for our growth of sample, when the temperature is relatively high, the resultant material is mainly $Fe_3N$.

FIG. 5 is the magnetic hysteresis hoop at room temperature of the $Fe_3N$ films growing at 1050° C. in the invention. The measurement was carried out by SQUID instrument produced by Quantum Design Company, and applied magnetic field is 0-20000 Oe, as shown in FIG. 5. It can be seen that, samples all have obvious room-temperature ferromagnetism.

FIG. 6 shows the center amplification graph, thus the magnetic hysteresis hoop of vertical and parallel magnetic fields can be seen more clearly.

The measurement of applying magnetic fields in parallel (H//(0001)) and perpendicularly (H⊥(0001)) to the plane of film had been made, and the result of measurement is show in FIG. 5. It can be seen that, samples all have obvious ferromagnetism at room temperature. For the two results of measurement in different applied magnetic fields' direction, when the direction of magnetic field parallel to the plane of films, magnetization intensity of sample is easier to be saturated, and when perpendicular to the plane of films, the larger applied magnetic field is need. This also indicates that, for the film sample made in the invention, the easy magnetism direction is parallel to the films, and the hard direction is perpendicular to the plane.

The invention is a kind of method of growing $Fe_3N$ films on sapphire substrate by the metal organic chemical vapor deposition MOCVD epitaxy growth system. $Fe_3N$ and $Fe_4N$ have high spin polarization, and have very good prospect in the application of magnetic storage and other magnetic function devices. $Fe_4N$ obtained great attention very early time. However, owing to the difficulties of material growth, it is also a difficulty to get good quality $Fe_3N$. There are no reports of growing $Fe_3N$ films on sapphire substrate by MOCVD. The invention is a method of growing $Fe_3N$ films on sapphire substrate by MOCVD, and it is the first time in the technology.

The growth method of metal organic chemical vapor deposition MOCVD technology is commonly a kind of growth method. However, how to select substrate, how to obtain high crystal and high quality films are well worth studying. There are problems need to be solved in the production including growth technology condition, design of buffer and so on. The invention is an invention in material, an improvement in growth method, and has further development in application.

The invention claimed is:

1. A growth method of Fe3N comprising: growing $Fe_3N$ in a metal organic chemical vapor deposition (MOCVD) system comprising the following process:
   1) heat treating a sapphire substrate at 1000-1100° C. and then pumping in ammonia into the MOCVD system to perform surface nitridation on the sapphire substrate at 1000-1100° C., controlling a flux of the ammonia at 500-700 sccm, such that a V/III ratio which denotes mole ratio of nitrogen and gallium is 500-50000;
   2) pumping in a carrier gas of $N_2$, an ammonia gas and an organic gallium source, and growing a 5-50 nm low temperature GaN buffer on the sapphire substrate which has been treated by the process in step 1), wherein the organic gallium source is trimethyl gallium with a flux of 1-50 sccm;
   3) after growing the low temperature GaN buffer, raising the MOCVD system temperature to 1000-1150° C., and then continuing to grow the GaN buffer for 10 minutes to get a GaN supporting layer of 50 nm;
   4) after growing the GaN supporting layer, pumping in $FeCp_2$ as a Fe source at a flux of the Fe source is 50-200 sccm to grow the $Fe_3N$, wherein a growth time of the $Fe_3N$ is 5-3600 s; and
   5) controlling the pressure of the MOCVD system to be at 0.1-2 atmospheric pressure.

2. The growth method of $Fe_3N$ according to claim 1, wherein in step 4) of growing the $Fe_3N$, hydrogen is introduced as a carrier gas, and the pressure in reaction chamber is controlled at 0.1 atmospheric pressure, to initially grow a $Fe_3N$ granular structure with a granular surface and to finally grow a $Fe_3N$ single crystal film with a surface with a layered structure, and further wherein raising a growth temperature results in the surface of the $Fe_3N$ single crystal film becoming the layered structure from the granular structure.

3. The growth method of Fe3N according to claim 2, wherein a growth temperature is a final growth temperature at 1050° C., and further wherein at 600° C. the layered structures have the granular structure with granules with heights of less than 100 nm, at 750° C. a size of the granules becomes bigger, a density of the granules becomes lesser, and the granules become flatter, and at 900° C. the surface of the $Fe_3N$ begins to form multiple layered structures, and finally when the growth temperature reaches 1050° C., the multiple layered structures of the $Fe_3N$ combine with each other, forming a plane film surface.

* * * * *